US009413336B2

(12) United States Patent
Takematsu

(10) Patent No.: US 9,413,336 B2
(45) Date of Patent: Aug. 9, 2016

(54) MULTIBAND-SUPPORT RADIO-FREQUENCY MODULE

(71) Applicant: Murata Manufacturing Co., Ltd., Kyoto (JP)

(72) Inventor: Yuji Takematsu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/856,948

(22) Filed: Sep. 17, 2015

(65) Prior Publication Data

US 2016/0006415 A1     Jan. 7, 2016

Related U.S. Application Data

(63) Continuation of application No. PCT/JP2013/082684, filed on Dec. 5, 2013.

(30) Foreign Application Priority Data

Apr. 19, 2013   (JP) .................................. 2013-088288

(51) Int. Cl.
*H01P 5/12*     (2006.01)
*H03H 11/04*    (2006.01)
(Continued)

(52) U.S. Cl.
CPC .................. *H03H 11/04* (2013.01); *H03F 1/32* (2013.01); *H03F 3/19* (2013.01); *H03F 3/195* (2013.01);
(Continued)

(58) Field of Classification Search
CPC ........ H03H 11/04; H03H 9/0566; H03F 1/32; H03F 3/19; H03F 3/195; H03F 3/21; H03F 3/213; H03F 3/245; H03F 3/60; H03F 2200/111; H03F 2200/222; H03F 2200/541; H04B 15/06

USPC .......................................................... 333/126
See application file for complete search history.

(56) References Cited

U.S. PATENT DOCUMENTS

| 2011/0050348 A1 | 3/2011 | Makioka | |
|---|---|---|---|
| 2011/0057730 A1 | 3/2011 | Makioka | |
| 2015/0349722 A1* | 12/2015 | Wang | H03F 1/26 330/295 |

FOREIGN PATENT DOCUMENTS

| JP | H04-306906 A | 10/1992 |
|---|---|---|
| JP | H09-289423 A | 11/1997 |

(Continued)

OTHER PUBLICATIONS

International Search Report issued in Application No. PCT/JP2013/082684 dated Mar. 4, 2014.
(Continued)

*Primary Examiner* — Robert Pascal
*Assistant Examiner* — Kimberly Glenn
(74) *Attorney, Agent, or Firm* — Pearne & Gordon LLP

(57) ABSTRACT

To provide a multiband-support radio-frequency module in which the occurrence of a harmonic signal in an amplifier circuit is suppressed and the output of a radio-frequency signal containing unwanted harmonic components is prevented. A first signal path SL1 and a second signal path SL2 are provided such that they intersect each other at least once in a multilayer substrate 2, as viewed from above. With this configuration, high-output radio-frequency signals output from a first amplifier circuit 31 and a second amplifier circuit 32 can be prevented from interfering with other elements disposed in the multilayer substrate 2. It is thus possible to provide a multiband-support radio-frequency module 1 exhibiting excellent RF characteristics by suppressing the occurrence of harmonic signals in each of the first and second amplifier circuits 31 and 32 and by preventing the output of radio-frequency signals containing unwanted harmonic components.

15 Claims, 11 Drawing Sheets

(51) Int. Cl.
   *H03F 3/195*   (2006.01)
   *H03F 3/213*   (2006.01)
   *H03F 3/24*    (2006.01)
   *H03F 1/32*    (2006.01)
   *H04B 15/06*   (2006.01)
   *H03F 3/19*    (2006.01)
   *H03F 3/21*    (2006.01)
   *H03F 3/60*    (2006.01)
   *H03H 9/05*    (2006.01)

(52) U.S. Cl.
   CPC .................. *H03F 3/21* (2013.01); *H03F 3/213* (2013.01); *H03F 3/245* (2013.01); *H03F 3/60* (2013.01); *H04B 15/06* (2013.01); *H03F 2200/111* (2013.01); *H03F 2200/222* (2013.01); *H03F 2200/451* (2013.01); *H03H 9/0566* (2013.01)

(56)    References Cited

FOREIGN PATENT DOCUMENTS

| JP | 2007-124202 A | 5/2007 |
| JP | 2011-055241 A | 3/2011 |
| JP | 2011-055446 A | 3/2011 |

OTHER PUBLICATIONS

Translation of Written Opinion issued in Application No. PCT/JP2013/082684 dated Mar. 4, 2014.

* cited by examiner

MULTIBAND-SUPPORT RADIO-FREQUENCY MODULE

FIELD OF THE DISCLOSURE

The present disclosure relates to a radio-frequency module including a multilayer substrate having a first signal path through which a radio-frequency signal of a first frequency band passes and a second signal path through which a radio-frequency signal of a second frequency band passes.

DESCRIPTION OF THE RELATED ART

Hitherto, as shown in FIGS. 13A and 13B, there is provided a multiband-support radio-frequency module 500 including a multilayer substrate 501 having a plurality of signal paths through which transmitting signals (radio-frequency signals) of different frequency bands pass. FIGS. 13A and 13B illustrate known modules, and are respectively a plan view and a circuit block diagram of the known modules. The radio-frequency module 500 includes a first signal path 502 through which a transmitting signal of the 800 MHz band passes and a second signal path 503 through which a transmitting signal of the 1.9 GHz band passes. In each of the signal paths 502 and 503, a power amplifier PA and a diplexer DPX connected subsequent to the power amplifier PA are disposed. Generally, each of the power amplifiers PA includes an amplifier circuit 504 and a matching circuit 505 connected subsequent to the amplifier circuit 504.

In the multiband-support radio-frequency module 500, for preventing the interference between the signal paths 502 and 503, the multilayer substrate 501 is divided into a plurality of regions A and B for the associated frequency bands. Then, in the divided regions A and B, the signal paths 502 and 503 for the associated frequency bands are provided. In each of the signal paths 502 and 503, various components, such as the power amplifier PA and the diplexer DPX, are disposed. A ground electrode is disposed between the regions A and B so as to prevent the interference between the signal paths 502 and 503 provided in the regions A and B, respectively.

In the radio-frequency module 500, in each of the regions A and B in which the signal paths 502 and 503 are respectively provided, for preventing the interference between the power amplifier PA and the diplexer DPX, the following measures are taken. A ground electrode for the power amplifier PA and a ground electrode for the diplexer DPX are separately disposed within the multilayer substrate 501 in a state in which they are electrically isolated from each other.

Generally, harmonic components equivalent to an integral multiple of an input radio-frequency signal of a desired frequency band are generated in a power amplifier PA, and the radio-frequency signal containing harmonic components is output from the power amplifier PA. The radio-frequency signal containing harmonic components output from the power amplifier PA is then input into a diplexer DPX. The diplexer DPX has a filtering function for allowing signals of only a desired frequency band to pass through the diplexer DPX. Accordingly, unwanted harmonic components are removed from the radio-frequency signal in the diplexer DPX, and as a result, a transmitting signal of a desired frequency band is output from the diplexer DPX.

Patent Document 1: Japanese Unexamined Patent Application Publication No. 2007-124202 (paragraphs 0020 to 0033, and 0057, FIGS. 1 to 3, etc.)

BRIEF SUMMARY OF THE DISCLOSURE

These days, communication mobile terminals, such as cellular phones and mobile information terminals, which support communication using multiple communication standards, such as the GSM (registered trademark) (Global System for Mobile Communications) standard and the CDMA (Code Division Multiple Access) standard, and the LTE (registered trademark) (Long Term Revolution) standard, are coming into widespread use. On a motherboard provided in such a communication mobile terminal, the multiband-support radio-frequency module 500 including a diplexer DPX for separating transmitting signals and received signals of different frequencies, a power amplifier PA for amplifying transmitting signals, a low-noise amplifier for amplifying received signals, and so on, as described above is mounted.

In accordance with a reduced size of communication mobile terminals, there is also a demand for further reducing the size of the radio-frequency module 500 mounted on such a communication mobile terminal. However, reducing the size of the radio-frequency module 500 presents the following problem. For reducing the size of the radio-frequency module 500, the size of the multilayer substrate 501 is also decreased. Accordingly, the physical length of a signal path between the power amplifier PA and the diplexer DPX disposed in each of the regions A and B of the multilayer substrate 501 is reduced, and thus, the signal paths 502 and 503 are wired with a minimal distance. The distance by which the loss incurred by wiring is minimized is called a minimal distance. Additionally, ground electrodes disposed for the power amplifier PA and for the diplexer DPX in the multilayer substrate 501 are also reduced in size.

In accordance with a reduced physical length of the signal path between the power amplifier PA and the diplexer DPX, the ground electrodes are also reduced in size, and thus, the ground electrodes are unable to perform their function properly. This causes a problem in which a high-output radio-frequency output from the power amplifier PA interferes with various components including the diplexer DPX and wiring electrodes disposed in the multilayer substrate 501. More specifically, a feedback loop is formed between the output side of the power amplifier PA or the radio-frequency module 500 and the input side of the power amplifier PA via, for example, a ground electrode or a space. Accordingly, since an output signal interferes with a signal input into the power amplifier PA, a harmonic signal generated in the power amplifier PA is amplified in the power amplifier PA and is output from the diplexer DPX without being sufficiently attenuated in the diplexer DPX. Moreover, a radio-frequency signal containing unwanted harmonic components output from the power amplifier PA is not input into the diplexer DPX, and instead, it is directly output from an output terminal of the radio-frequency module 500 via, for example, a ground electrode or a space. This causes a problem in which the RF characteristics of the radio-frequency module 500 are decreased.

This disclosure has been made in view of the above-described problems. It is an object of the disclosure to provide a multiband-support radio-frequency module in which the occurrence of a harmonic signal in an amplifier circuit is suppressed and the output of a radio-frequency signal containing unwanted harmonic components is prevented.

According to the present invention, in order to achieve the above-described object, there is provided a radio-frequency module including a multilayer substrate having a first signal path through which a radio-frequency signal of a first frequency band passes and a second signal path through which a radio-frequency signal of a second frequency band passes. The first signal path includes a first amplifier circuit, a first matching circuit connected subsequent to the first amplifier circuit, and a first filter circuit connected subsequent to the first matching circuit. The second signal path includes a second amplifier circuit, a second matching circuit connected subsequent to the second amplifier circuit, and a second filter circuit connected subsequent to the second matching circuit. A portion of the first signal path which is subsequent to the first amplifier circuit and which is prior to the first filter circuit and a portion of the second signal path which is subsequent to the second amplifier circuit and which is prior to the second filter circuit intersect each other at least once in the multilayer substrate, as viewed from above.

In the disclosure configured as described above, the first signal path through which a radio-frequency signal of the first frequency band passes includes the first amplifier circuit, the first matching circuit connected subsequent to the first amplifier circuit, and the first filter circuit connected subsequent to the first matching circuit. The second signal path through which a radio-frequency signal of the second frequency band passes includes the second amplifier circuit, the second matching circuit connected subsequent to the second amplifier circuit, and the second filter circuit connected subsequent to the second matching circuit. A portion of the first signal path which is subsequent to the first amplifier circuit and which is prior to the first filter circuit and a portion of the second signal path which is subsequent to the second amplifier circuit and which is prior to the second filter circuit intersect each other at least once in the multilayer substrate, as viewed from above.

The first and second signal paths intersect each other at least once in the multilayer substrate, as viewed from above. Accordingly, the physical length of the first signal path between the first amplifier circuit and the first filter circuit and the physical length of the second signal path between the second amplifier circuit and the second filter circuit are sufficiently long, in comparison with a known radio-frequency module in which the signal paths are wired with a minimal distance. Thus, for the first signal path between the first amplifier circuit and the first filter circuit and the second signal path between the second amplifier circuit and the second filter circuit, larger ground electrodes than those used in a known radio-frequency module may be disposed. Hitherto, ground electrodes are independently provided for individual functions, such as amplifier circuits and filter circuits, such that they are electrically isolated from each other. Unlike a known radio-frequency module, however, a large ground electrode may be disposed. Even in this case, since the first signal path between the first amplifier circuit and the first filter circuit and the second signal path between the second amplifier circuit and the second filter circuit are sufficiently long, the ground electrode is able to perform its function properly. Accordingly, the state in which the radio-frequency module is grounded is close to the ideal state so that the radio-frequency module can be stably grounded.

Therefore, it is possible to prevent high-output radio-frequency signals output from the first and second amplifier circuits from respectively interfering with the first and second filter circuits and the first and second signal paths disposed on the multilayer substrate. More specifically, it is possible to prevent the formation of a feedback loop between the output side of each of the first and second amplifier circuits and the input side thereof via, for example, the ground electrode or a space. As a result, the occurrence of a harmonic signal in each of the first and second amplifier circuits can be suppressed, which would be caused by the interference of an output signal from each of the first and second amplifier circuits on an input signal thereof.

It is also possible to prevent radio-frequency signals containing unwanted harmonic components which are output from the first and second amplifier circuits from being directly output from the radio-frequency module via, for example, the ground electrode or a space, instead of being input into the first and second filter circuits. It is thus possible to provide a multiband-support radio-frequency module exhibiting excellent RF characteristics by preventing the output of radio-frequency signals containing unwanted harmonic components.

The first amplifier circuit may be disposed in a first region of the multilayer substrate. The second amplifier circuit may be disposed in a second region of the multilayer substrate. The first filter circuit may be disposed in the second region. The second filter circuit may be disposed in the first region.

With this configuration, the first filter circuit disposed in the first signal path is located in the second region, which is different from the first region of the multilayer substrate in which the first amplifier circuit is located. The second filter circuit disposed in the second signal path is located in the first region, which is different from the second region of the multilayer substrate in which the second amplifier circuit is located. In this manner, the position of the first filter circuit and the position of the second filter circuit are reversed between the first and second regions. Accordingly, a portion of the first signal path which is subsequent to the first amplifier circuit and which is prior to the first filter circuit and a portion of the second signal path which is subsequent to the second amplifier circuit and which is prior to the second filter circuit intersect each other at least once in the multilayer substrate, as viewed from above. With this configuration, the physical length of the first signal path between the first amplifier circuit and the first filter circuit and the physical length of the second signal path between the second amplifier circuit and the second filter circuit are sufficiently long. It is thus possible to provide a radio-frequency module exhibiting excellent RF characteristics by preventing the output of radio-frequency signals containing unwanted harmonic components.

The first amplifier circuit may be disposed in a first region of the multilayer substrate. The second amplifier circuit may be disposed in a second region of the multilayer substrate. The first matching circuit may be disposed in the second region. The second matching circuit may be disposed in the first region.

With this configuration, the first matching circuit disposed in the first signal path is located in the second region, which is different from the first region of the multilayer substrate in which the first amplifier circuit is located. The second matching circuit disposed in the second signal path is located in the first region, which is different from the second region of the multilayer substrate in which the second amplifier circuit is located. In this manner, the position of the first matching circuit and the position of the second matching circuit are reversed between the first and second regions. Accordingly, a portion of the first signal path which is subsequent to the first amplifier circuit and which is prior to the first filter circuit and a portion of the second signal path which is subsequent to the second amplifier circuit and which is prior to the second filter circuit intersect each other at least once in the multilayer substrate, as viewed from above. With this configuration, the physical length of the first signal path between the first amplifier circuit and the first filter circuit and the physical length of the second signal path between the second amplifier circuit and the second filter circuit are sufficiently long. It is thus possible to provide a radio-frequency module exhibiting excellent RF characteristics by preventing the output of radio-frequency signals containing unwanted harmonic components.

The first signal path and the second signal path may intersect each other two or more times.

With this configuration, since the first and second signal paths intersect each other two or more times, the lengths of the signal paths can be increased to be even longer. It is thus possible to provide a radio-frequency module exhibiting even more excellent RF characteristics by preventing the output of radio-frequency signals containing unwanted harmonic components.

The physical length of the first signal path between the first amplifier circuit and the first filter circuit and the physical length of the second signal path between the second amplifier circuit and the second filter circuit are sufficiently long. Accordingly, at the above-described portions of the first and second signal paths, a directional coupler, a filter circuit, and so on, can be provided in each of the first and second signal paths.

A first directional coupler may be disposed in the first signal path, and a second directional coupler may be disposed in the second signal path.

With this configuration, the first directional coupler is able to extract a radio-frequency signal output from the first amplifier circuit from the first signal path, so that it can detect, for example, the signal level of the extracted radio-frequency signal by using, for example, a detection circuit. The second directional coupler is able to extract a radio-frequency signal output from the second amplifier circuit from the second signal path, so that it can detect, for example, the signal level of the extracted radio-frequency signal by using, for example, a detection circuit. Since the first and second signal paths intersect each other, the signal paths (wiring patterns) can become longer, thereby making it possible to improve the directivity of the directional couplers. It is thus possible to exclude, for example, a radio-frequency signal of reflected waves returning from an antenna and to detect radio-frequency signals only output from the amplifier circuits by using the directional couplers.

A third filter circuit may be disposed in the first signal path, and a fourth filter circuit may be disposed in the second signal path.

With this configuration, by the provision of the third and fourth filter circuits disposed in the first and second signal paths, respectively, harmonic components contained in radio-frequency signals output from the first and second amplifiers circuits can be attenuated. It is thus possible to provide a radio-frequency module exhibiting even more excellent RF characteristics.

According to the present invention, high-output radio-frequency signals output from the first and second amplifier circuits can be prevented from respectively interfering with the first and second filter circuits and the first and second signal paths disposed in the multilayer substrate. It is thus possible to provide a multiband-support radio-frequency module exhibiting excellent RF characteristics by suppressing the occurrence of harmonic signals in each of the first and second amplifier circuits and by preventing the output of radio-frequency signals containing unwanted harmonic components.

BRIEF DESCRIPTION OF THE SEVERAL VIEWS OF THE DRAWINGS

FIGS. 2A to 2E illustrate the different insulating layers.

FIG. 3A illustrates the signal paths prior to amplifier circuits and FIG. 3B illustrates the signal paths subsequent to the amplifier circuits.

FIG. 4A illustrates the power density of second harmonic components and FIG. 4B illustrates the power density of third harmonic components.

FIG. 5A illustrates the power density of second harmonic components and FIG. 5B illustrates the power density of third harmonic components.

FIG. 13A is a plan view and FIG. 13B is a circuit block diagram.

DETAILED DESCRIPTION OF THE DISCLOSURE

First Embodiment

Figure 1:
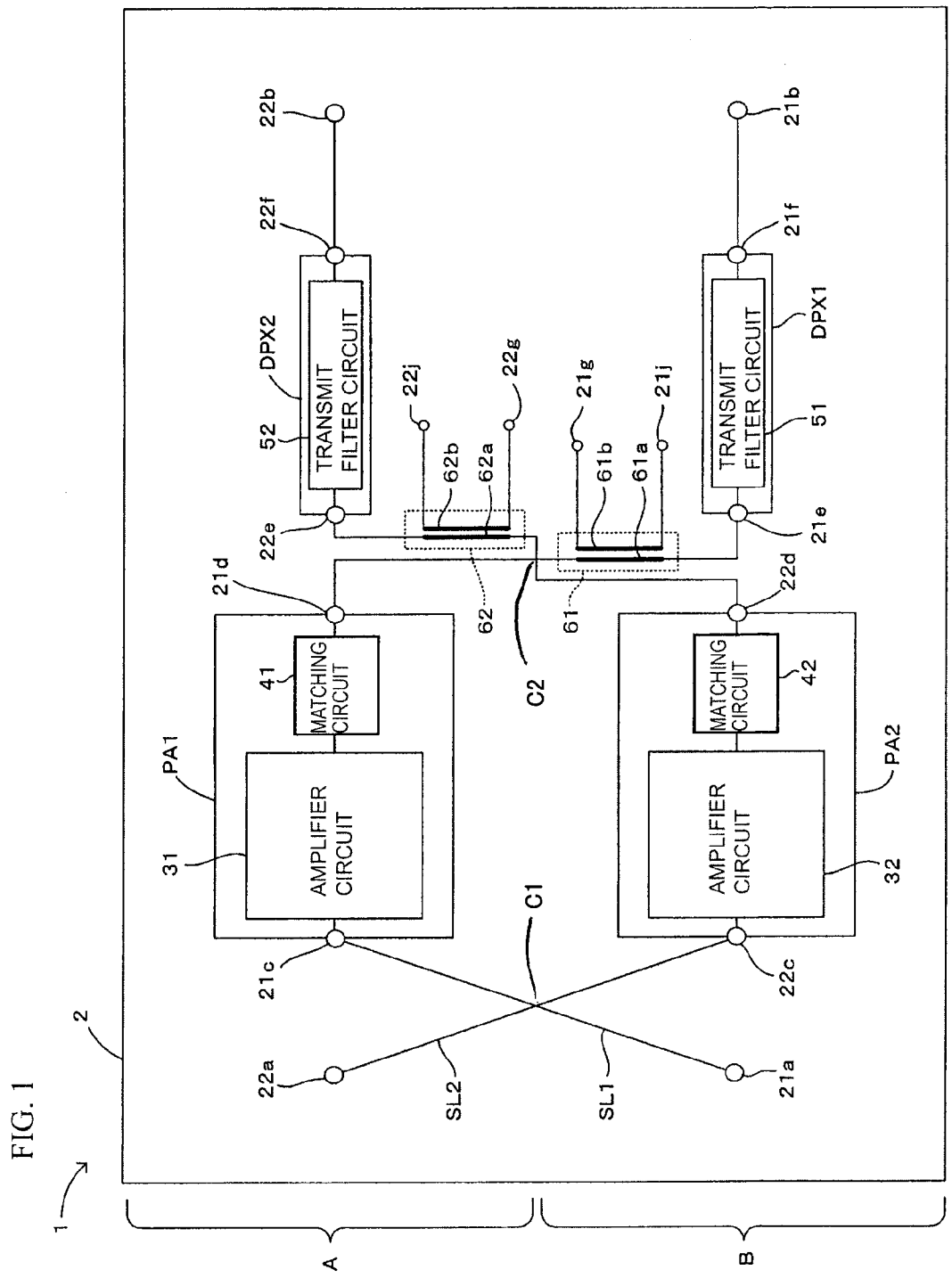
FIG. 1 is a diagram illustrating a first embodiment of a radio-frequency module of the present invention.
Figure 2A:
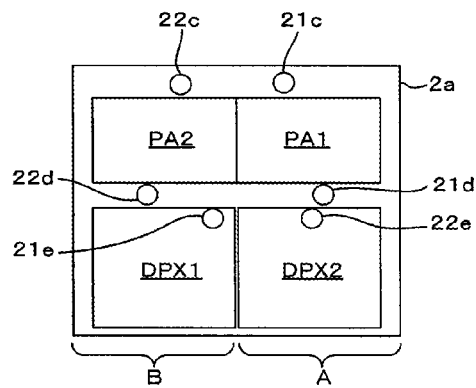
FIGS. 2A to 2E show plan views illustrating insulating layers of a multilayer substrate included in the radio-frequency module shown in FIG. 1.
Figure 2D:
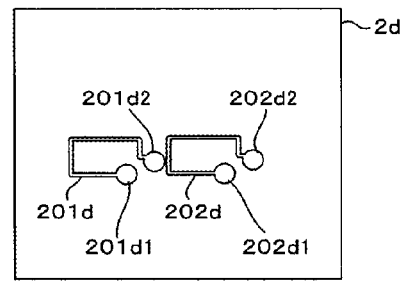
Figure 2B:
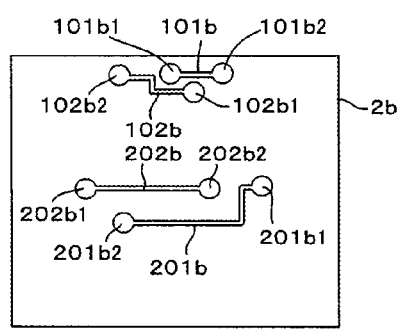
Figure 2E:
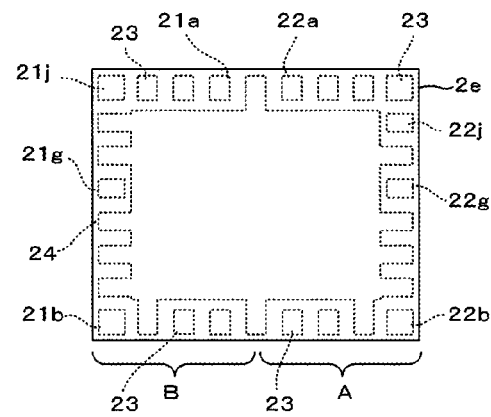
Figure 2C:
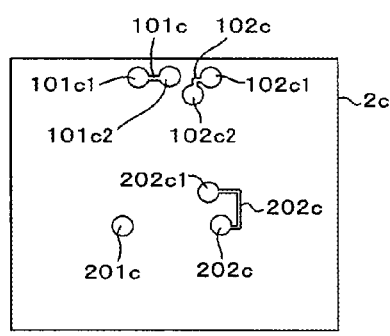
Figure 3A:
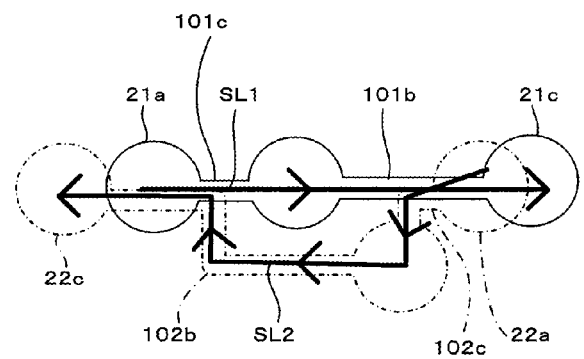
FIGS. 3A and 3B show diagrams illustrating a first signal path and a second signal path, as viewed from above.
Figure 3B:
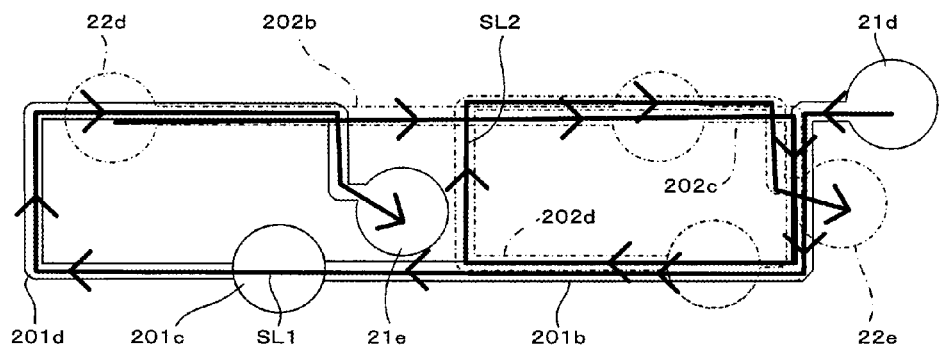

A first embodiment of a radio-frequency module according to the present disclosure will be described below with reference to FIGS. 1 through 5. FIG. 1 is a diagram illustrating the first embodiment of a radio-frequency module of the present invention. FIGS. 2A to 2E show plan views illustrating insulating layers of a multilayer substrate included in the radio-frequency module shown in FIG. 1. FIGS. 2A to 2E illustrate the different insulating layers. FIGS. 3A and 3B show diagrams illustrating a first signal path and a second signal path, as viewed from above. FIG. 3A illustrates the signal paths prior to amplifier circuits, and FIG. 3B illustrates the signal paths subsequent to the amplifier circuits.

Figure 4A:
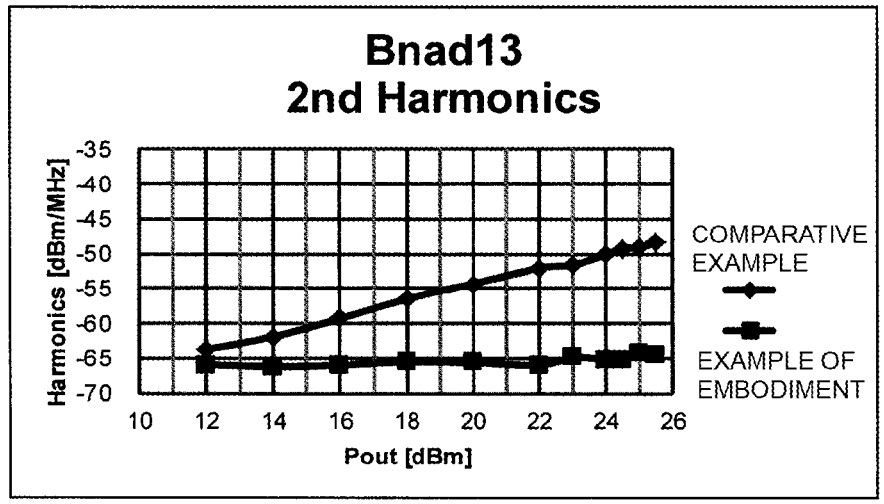
FIGS. 4A and 4B show diagrams illustrating the power density of harmonic components contained in a radio-frequency signal output from the first signal path of the radio-frequency module shown in FIG. 1.
Figure 4B:
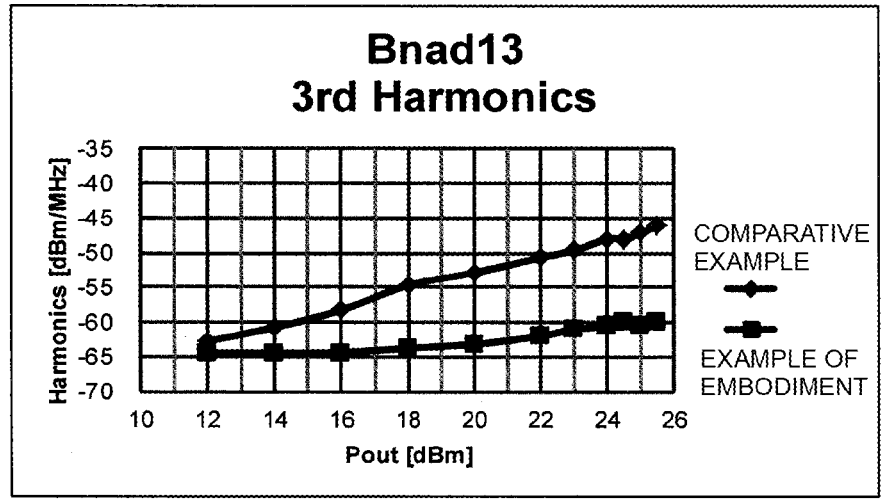
Figure 5A:
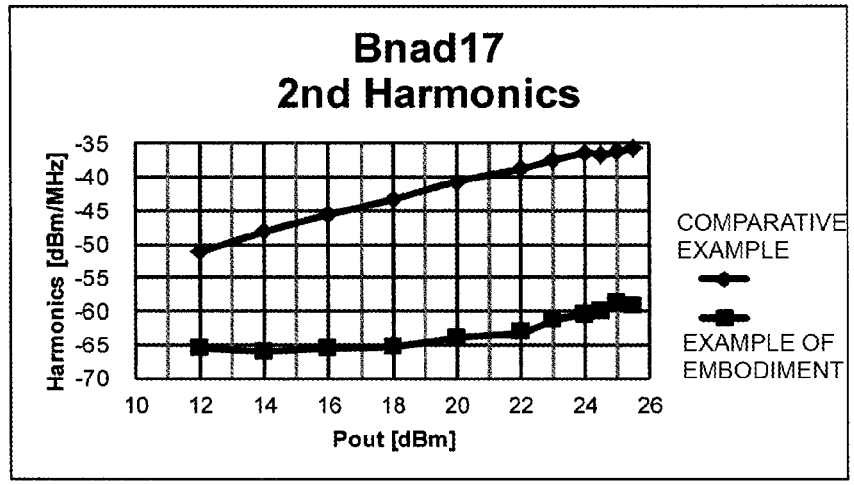
FIGS. 5A and 5B show diagrams illustrating the power density of harmonic components contained in a radio-frequency signal output from the second signal path of the radio-frequency module shown in FIG. 1.
Figure 5B:
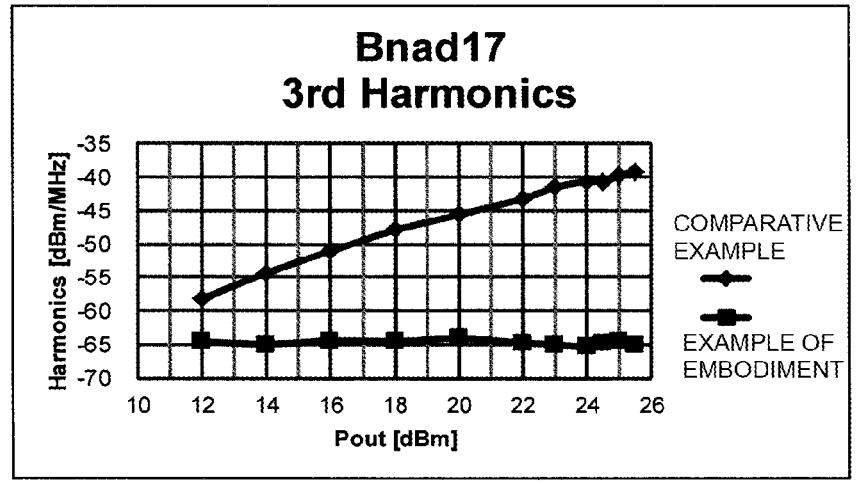

FIGS. 4A and 4B show diagrams illustrating the power density of harmonic components contained in a radio-frequency signal output from the first signal path of the radio-frequency module shown in FIG. 1. FIG. 4A illustrates the power density of second harmonic components, and FIG. 4B illustrates the power density of third harmonic components. FIGS. 5A and 5B show diagrams illustrating the power density of harmonic components contained in a radio-frequency signal output from the second signal path of the radio-frequency module shown in FIG. 1. FIG. 5A illustrates the power density of second harmonic components, and FIG. 5B illustrates the power density of third harmonic components.

In FIGS. 1 and 2A to 2E, only the major configurations related to the present disclosure are shown, and the other configurations are not shown for the sake of simple representation. As well as in FIG. 1, in FIGS. 6 through 12 which illustrate second through fifth embodiments discussed later, only the major configurations are shown, and an explanation thereof will be omitted.

(Configuration)

A radio-frequency module 1 shown in FIG. 1 is a module mounted on, for example, a motherboard provided in a communication mobile terminal, such as a cellular phone or a mobile information terminal, having a communication function. In this embodiment, the radio-frequency module 1 includes a multilayer substrate 2. In the multilayer substrate 2, a first signal path SL1 through which a transmitting signal (radio-frequency signal) of a first frequency band (Band 13) passes and a second signal path SL2 through which a transmitting signal (radio-frequency signal) of a second frequency band (Band 17) passes are provided.

In the first signal path SL1, a first power amplifier PA1 and a diplexer DPX1 are disposed. The first power amplifier PA1 includes a first amplifier circuit 31 and a first matching circuit 41 connected subsequent to the first amplifier circuit 31. The diplexer DPX1 includes a first transmit filter circuit 51 (corresponding to a "first filter circuit" of the present invention) connected subsequent to the first matching circuit 41. In the second signal path SL2, a second power amplifier PA2 and a diplexer DPX2 are disposed. The second power amplifier PA2 includes a second amplifier circuit 32 and a second matching circuit 42 connected subsequent to the second amplifier circuit 32. The diplexer DPX2 includes a second transmit filter circuit 52 (corresponding to a "second filter circuit" of the present invention) connected subsequent to the second matching circuit 42. A receiving filter circuit for received signals included in each of the diplexers DPX1 and DPX2 is not shown for the sake of simple representation.

The first and second power amplifiers PA1 and PA2 are used to respectively amplify the signal levels of transmitting signals of the first and second frequency bands which are input into the first and second signal paths SL1 and SL2. The first and second amplifier circuits 31 and 32 are formed by typical power amplifier devices, such as heterojunction bipolar transistors or field-effect transistors. The first and second matching circuits 41 and 42 are used to respectively match the output impedances of the amplifier circuits 31 and 32 to a predetermined value (for example, 50Ω).

The first and second diplexers DPX1 and DPX2 are used to separate a transmitting signal and a received signal from each other. The first and second transmit filter circuits 51 and 52 and the receiving filter circuits are constituted by typical filter circuits, such as SAW (surface acoustic wave) filter devices, BAW (bulk acoustic wave) filter devices, LC filters, and dielectric filters. The first and second transmit filter circuits 51 and 52 are formed as band-pass filters. More specifically, the first transmit filter circuit 51 allows a radio-frequency signal of the first frequency band to pass therethrough, while the second transmit filter circuit 52 allows a radio-frequency signal of the second frequency band to pass therethrough.

The first power amplifier PA1 (first amplifier circuit 31 and first matching circuit 41) is disposed in a first region A of the multilayer substrate 2, while the second power amplifier PA2 (second amplifier circuit 32 and second matching circuit 42) is disposed in a second region B of the multilayer substrate 2. The first diplexer DPX1 (first transmit filter circuit 51) is disposed in the second region B of the multilayer substrate 2, while the second diplexer DPX2 (second transmit filter circuit 52) is disposed in the first region A of the multilayer substrate 2.

On the back surface of the multilayer substrate 2 in the second region B, a first input electrode 21a into which a transmitting signal of the first frequency band is input from the exterior and a first output electrode 21b from which this transmitting signal is output are disposed. The first signal path SL1 is formed between the first input electrode 21a and the first output electrode 21b. On the front surface of the multilayer substrate 2 in the first region A, mounting electrodes 21c and 21d on which the first power amplifier PA1 is mounted are disposed. The first input electrode 21a and the mounting electrode 21c are connected to each other by using a wiring electrode within the multilayer substrate 2. On the front surface of the multilayer substrate 2 in the second region B, mounting electrodes 21e and 21f on which the first diplexer DPX1 is mounted are disposed. By using wiring electrodes within the multilayer substrate 2, the mounting electrodes 21d and 21e are connected to each other and the mounting electrode 21f and the first output electrode 21b are connected to each other.

On the back surface of the multilayer substrate 2 in the first region A, a second input electrode 22a into which a transmitting signal of the second frequency band is input from the exterior and a second output electrode 22b from which this transmitting signal is output are disposed. The second signal path SL2 is formed between the second input electrode 22a and the second output electrode 22b. On the front surface of the multilayer substrate 2 in the second region B, mounting electrodes 22c and 22d on which the second power amplifier PA2 is mounted are disposed. The second input electrode 22a and the mounting electrode 22c are connected to each other by using a wiring electrode within the multilayer substrate 2. On the front surface of the multilayer substrate 2 in the first region A, mounting electrodes 22e and 22f on which the second diplexer DPX2 is mounted are disposed. By using wiring electrodes within the multilayer substrate 2, the mounting electrodes 22d and 22e are connected to each other and the mounting electrode 22f and the second output electrode 22b are connected to each other.

In an area prior to the power amplifiers PA1 and PA2, the first and second signal paths SL1 and SL2 intersect each other at C1 in the multilayer substrate 2, as viewed from above. The first input electrode 21a disposed in the second region B and the mounting electrode 21c disposed in the first region A are connected to each other. The second input electrode 22a disposed in the first region A and the mounting electrode 22c disposed in the second region B are connected to each other.

A portion of the first signal path SL1 which is subsequent to the first power amplifier PA1 and which is prior to the diplexer DPX1 and a portion of the second signal path SL2 which is subsequent to the second power amplifier PA2 and which is prior to the diplexer DPX2 interest each other at C2 in the multilayer substrate 2, as viewed from above. Then, the mounting electrode 21d disposed in the first region A and the mounting electrode 21e disposed in the second region B are connected to each other. The mounting electrode 22d disposed in the second region B and the mounting electrode 22e disposed in the first region A are connected to each other.

First and second directional couplers 61 and 62 (couplers) are disposed in the first and second signal paths SL1 and SL2, respectively. The first and second directional couplers 61 and 62 are respectively used to extract transmitting signals (radio-frequency signals) output from the power amplifiers PA1 and PA2 and detect the signal levels of the extracted transmitting signals by using, for example, detection circuits so as to control the power amplifiers PA1 and PA2 on the basis of the detected signal levels.

The first directional coupler 61 includes a coil pattern 61a formed in the first signal path SL1 and a coil pattern 61b formed in the same plane of an insulating layer on which the coil pattern 61a is formed or in an insulating layer adjacent to this insulating layer. One end of the coil pattern 61b is connected to a first signal-extracting electrode 21g disposed on the back surface of the multilayer substrate 2, and the other end of the coil pattern 61b is connected to a first external-terminator-connecting electrode 21j disposed on the back surface of the multilayer substrate 2.

The second directional coupler 62 includes a coil pattern 62a formed in the second signal path SL2 and a coil pattern 62b formed in the same plane of an insulating layer on which the coil pattern 62a is formed or in an insulating layer adjacent to this insulating layer. One end of the coil pattern 62b is connected to a second signal-extracting electrode 22g disposed on the back surface of the multilayer substrate 2, and the other end of the coil pattern 62b is connected to a second external-terminator-connecting electrode 22j disposed on the back surface of the multilayer substrate 2.

(Multilayer Substrate)

The multilayer substrate 2 in which the first and second signal paths SL1 and SL2 are formed will be described below with reference to FIGS. 2A to 2E, 3A and 3B.

In this embodiment, as shown in FIGS. 2A to 2E, the multilayer substrate 2 includes five insulating layers 2a through 2e, and the insulating layers 2a through 2e are sequentially stacked on each other from the bottommost insulating layer 2e to the topmost insulating layer 2a in this order. On the front surface of the insulating layer 2a, which forms the front surface of the multilayer substrate 2, a plurality of mounting electrodes including the mounting electrodes 21c, 21d, 21e, 22c, 22d, and 22e are formed. Various electronic components, for example, radio-frequency circuit components, such as the power amplifiers PA1 and PA2, matching circuits (not shown), the diplexers DPX1 and DPX2, a switch IC (not shown), a low-noise amplifier (not shown), and ceramic multilayer components (not shown), such as chip resistors, chip capacitors, and chip coils, are mounted on the associated mounting electrodes.

On the back surface of the insulating layer 2e, which forms the back surface of the multilayer substrate 2, external-connecting signal electrodes 23 including the input electrodes 21a and 22a, the output electrodes 21b and 22b, the signal-extracting electrodes 21g and 22g, and the external-terminator-connecting electrodes 21j and 22j, and a ground electrode 24 used for grounding are formed. On the insulating layers 2b, 2c, and 2d, internal wiring electrodes, such as in-plane electrodes and via-conductors (interlayer connecting conductors: not shown), are formed. The internal wiring electrodes formed on the insulating layers 2b, 2c, and 2d are connected to each other within the multilayer substrate 2 so as to form the signal paths SL1 and SL2.

More specifically, in-plane electrodes 101b, 102b, 201b, and 202b are formed on the insulating layer 2b, in-plane electrodes 101c, 102c, 201c, and 202c are formed on the insulating layer 2c, and in-plane electrodes 201d and 202d are formed on the insulating layer 2d. These in-plane electrodes are connected to each other between the layers by using via-electrodes, which are not shown, in the following manner so as to form the signal paths SL1 and SL2.

One end 101c1 of the in-plane electrode 101c on the insulating layer 2c is connected to the first input electrode 21a on the insulating layer 2e, and the other end 101c2 of the in-plane electrode 101c is connected to one end 101b1 of the in-plane electrode 101b on the insulating layer 2b. The other end 101b2 of the in-plane electrode 101b on the insulating layer 2b is connected to the mounting electrode 21c on the insulating layer 2a by using a via-conductor and a wiring pattern, which are not shown. In this manner, a portion of the first signal path SL1 prior to the first power amplifier PA1 is formed. One end 201b1 of the in-plane electrode 201b on the insulating layer 2b is connected to the mounting electrode 21d on the insulating layer 2a, and the other end 201b2 of the in-plane electrode 201b is connected to one end 201d1 of the in-plane electrode 201d on the insulating layer 2d via the in-plane electrode 201c on the insulating layer 2c. The other end 201d2 of the in-plane electrode 201d on the insulating layer 2d is connected to the mounting electrode 21e on the insulating layer 2a. In this manner, a portion of the first signal path SL1 between the first power amplifier PA1 and the first diplexer DPX1 is formed.

One end 102c1 of the in-plane electrode 102c on the insulating layer 2c is connected to the second input electrode 22a on the insulating layer 2e, and the other end 102c2 of the in-plane electrode 102c is connected to one end 102b1 of the in-plane electrode 102b on the insulating layer 2b. The other end 102b2 of the in-plane electrode 102b on the insulating layer 2b is connected to the mounting electrode 22c on the insulating layer 2a by using a via-conductor and a wiring pattern, which are not shown. In this manner, a portion of the second signal path SL2 prior to the second power amplifier PA2 is formed. One end 202b1 of the in-plane electrode 202b on the insulating layer 2b is connected to the mounting electrode 22d on the insulating layer 2a, and the other end 202b2 of the in-plane electrode 202b is connected to one end 202c1 of the in-plane electrode 202c on the insulating layer 2c. The other end 202c2 of the in-plane electrode 202c on the insulating layer 2c is connected to one end 202d1 of the in-plane electrode 202d on the insulating layer 2d, and the other end 202d2 of the in-plane electrode 201d on the insulating layer 2d is connected to the mounting electrode 22e on the insulating layer 2a. In this manner, a portion of the second signal path SL1 between the second power amplifier PA2 and the second diplexer DPX2 is formed.

By connecting the in-plane electrodes as described above, the signal paths SL1 and SL2 are formed. As a result, as shown in FIG. 3A, a portion of the first signal path SL1 prior to the first power amplifier PA1 and a portion of the second signal path SL2 prior to the second power amplifier PA2 intersect each other in the multilayer substrate 2, as viewed from above. As shown in FIG. 3B, a portion of the first signal path SL1 which is subsequent to the first power amplifier PA1 and which is prior to the diplexer DPX1 and a portion of the second signal path SL2 which is subsequent to the second power amplifier PA2 and which is prior to the diplexer DPX2 intersect each other two or more times in the multilayer substrate 2, as viewed from above.

In this embodiment, the multilayer substrate 2 is formed as an integral ceramic multilayer body by stacking the plurality of insulating layers 2a through 2e, which are made from ceramic green sheets, on each other and by firing them. More specifically, the insulating layers 2a through 2e are formed in the following manner. Slurry in which mixed powder of, for example, alumina and glass, is mixed with an organic binder and a solvent is formed into sheets in a molding die so as to form ceramic green sheets, which form the insulating layers 2a through 2e. The ceramic green sheets are formed so that they can be fired at a low temperature of about 1000° C. The ceramic green sheets are then cut into a predetermined shape. Then, via-holes are formed, by laser processing, in the ceramic green sheets. A conductive paste containing Ag or Cu is then charged into the formed via-holes, or via-filling plating is performed on the via-holes so as to form interlayer-connecting via-conductors. Then, various in-plane electrodes are formed by printing a conductive paste. As a result, the insulating layers are formed.

Circuit devices, such as capacitors and coils, may be formed by the in-plane electrodes and via-conductors formed on the insulating layers, and filter circuits and matching circuits may be formed by the circuit devices, such as capacitors and coils. The multilayer substrate 2 may be made of a resin or polymer material. The configuration of the multilayer substrate 2, for example, the number of layers forming the multilayer substrate 2, is not restricted to the above-described configuration, and may be suitably designed according to, for example, the purpose of use of the radio-frequency module 1.

(Radio-Frequency Characteristics)

The radio-frequency (RF) characteristics of the radio-frequency module 1 will be discussed below with reference to FIGS. 4A, 4B, 5A and 5B. In FIGS. 4A, 4B, 5A and 5B, the horizontal axis indicates the output power [dBm] of a radio-frequency signal output from a radio-frequency module, and the vertical axis indicates the power density [dBm/MHz] of harmonic components contained in a radio-frequency signal output from the radio-frequency module. In each of FIGS. 4A, 4B, 5A and 5B, the solid squares indicate radio-frequency characteristics of an example of the radio-frequency module 1 in this embodiment, while the solid rhombuses indicate radio-frequency characteristics of a comparative example, which is a known radio-frequency module.

As shown in FIGS. 4A and 4B, in the example of this embodiment, the magnitudes of the power density of second harmonics (FIG. 4A) and third harmonics (FIG. 4B) contained in a radio-frequency signal output from the radio-frequency module 1 when a transmitting signal of the first frequency band (Band 13) is input into the first signal path SL1 are suppressed over the entire range of output power, in comparison with those of the comparative example. As shown in FIGS. 5A and 5B, in the example of this embodiment, the magnitudes of the power density of second harmonics (FIG. 5A) and third harmonics (FIG. 5B) contained in a radio-frequency signal output from the radio-frequency module 1 when a transmitting signal of the second frequency band (Band 17) is input into the second signal path SL2 are suppressed over the entire range of output power, in comparison with those of the comparative example.

As described above, in this embodiment, the first signal path SL1 through which a radio-frequency signal of the first frequency band passes includes the first amplifier circuit 31, the first matching circuit 41 connected subsequent to the first amplifier circuit 31, and the first transmit filter circuit 51 connected subsequent to the first matching circuit 41. The second signal path SL2 through which a radio-frequency signal of the second frequency band passes includes the second amplifier circuit 32, the second matching circuit 42 connected subsequent to the second amplifier circuit 32, and the second transmit filter circuit 52 connected subsequent to the second matching circuit 42. A portion of the first signal path SL1 which is subsequent to the first matching circuit 41 and which is prior to the first transmit filter circuit 51 and a portion of the second signal path SL2 which is subsequent to the second matching circuit 42 and which is prior to the second transmit filter circuit 52 intersect each other at least once in the multilayer substrate 2.

The first and second signal paths SL1 and SL2 intersect each other at least once in the multilayer substrate 2, as viewed from above. Accordingly, the physical length of the first signal path SL1 between the first amplifier circuit 31 and the first transmit filter circuit 51 and the physical length of the second signal path SL2 between the second amplifier circuit 32 and the second transmit filter circuit 52 are sufficiently long, in comparison with a known radio-frequency module in which the signal paths are wired with a minimal distance. Thus, for the first signal path SL1 between the first amplifier circuit 31 and the first transmit filter circuit 51 and the second signal path SL2 between the second amplifier circuit 32 and the second transmit filter circuit 52, larger ground electrodes used for grounding than those used in a known radio-frequency module may be disposed on the back surface of the multilayer substrate 2 and within the insulating layers.

Hitherto, ground electrodes are independently provided for individual functions, such as the amplifier circuits 31 and 32 and the transmit filter circuits 51 and 52, such that they are electrically isolated from each other. Unlike a known radio-frequency module, however, a large ground electrode 24 may be disposed. Even in this case, since the first signal path SL1 between the first amplifier circuit 31 and the first transmit filter circuit 51 and the second signal path SL2 between the second amplifier circuit 32 and the second transmit filter circuit 52 are sufficiently long, the ground electrode 24 is able to perform its function properly. Accordingly, the state in which the radio-frequency module 1 is grounded is close to the ideal state so that the radio-frequency module 1 can be stably grounded.

Therefore, it is possible to prevent high-output radio-frequency signals output from the first and second amplifier circuits 31 and 32 from respectively interfering with the first and second transmit filter circuits 51 and 52 and the first and second signal paths SL1 and SL2 disposed on the multilayer substrate 2. More specifically, it is possible to prevent the formation of a feedback loop between the output side of each of the first and second amplifier circuits 31 and 32 and the input side thereof via, for example, the ground electrode 24 or a space. As a result, the occurrence of a harmonic signal in each of the first and second amplifier circuits 31 and 32 can be suppressed, which would be caused by the interference of an output signal from each of the first and second amplifier circuits 31 and 32 on an input signal thereof.

It is also possible to prevent radio-frequency signals containing unwanted harmonic components which are output from the first and second amplifier circuits 31 and 32 from being directly output from the radio-frequency module 1 via, for example, the ground electrode 24 or a space, instead of being input into the first and second transmit filter circuits 51 and 52. It is thus possible to provide the multiband-support radio-frequency module 1 exhibiting excellent RF characteristics by preventing the output of radio-frequency signals containing unwanted harmonic components.

In an area prior to the power amplifiers PA1 and PA2, the first and second signal paths SL1 and SL2 intersect each other in the multilayer substrate 2, as viewed from above. Accordingly, the first input electrode 21a and the first output electrode 21b are located in the same second region B of the multilayer substrate 2, and the second input electrode 22a and the second output electrode 22b are located in the same first region A of the multilayer substrate 2. It is thus possible to provide the radio-frequency module 1 of a practical structure in which, when externally connecting the radio-frequency module 1, the incorrect external connection of the electrodes 21a, 21b, 22a, and 22b can be prevented.

If the radio-frequency module 1 is mounted on a communication system in which the first signal path SL1 (first frequency band) and the second signal path SL2 (second frequency band) are not used at the same time, the following advantages are obtained. When the first signal path SL1 is used, the second signal path SL2 is not used. Accordingly, a radio-frequency signal of a second frequency band passing through the second signal path SL2 can be prevented from influencing a radio-frequency signal of a first frequency band output from the first signal path SL1. When the second signal path SL2 is used, the first signal path SL1 is not used. Accordingly, a radio-frequency signal of a first frequency band passing through the first signal path SL1 can be prevented from influencing a radio-frequency signal of a second frequency band output from the second signal path SL2. As a result, it is possible to further enhance the RF characteristics of the radio-frequency module 1.

The first diplexer DPX1 (first transmit filter circuit 51) disposed in the first signal path SL1 is located in the second region B, which is different from the first region A of the multilayer substrate 2 in which the first power amplifier PA1 (first amplifier circuit 31) is located. The second diplexer DPX2 (second transmit filter circuit 52) disposed in the second signal path SL2 is located in the first region A, which is different from the second region B of the multilayer substrate 2 in which the second power amplifier PA2 (second amplifier circuit 32) is located.

In this manner, the position of the first diplexer DPX1 and the position of the second diplexer DPX2 are reversed between the first and second regions A and B. Accordingly, a portion of the first signal path SL1 which is subsequent to the first power amplifier PA1 and which is prior to the first diplexer DPX1 and a portion of the second signal path SL2 which is subsequent to the second power amplifier PA2 and which is prior to the second diplexer DPX2 intersect each other at least once in the multilayer substrate 2, as viewed from above. With this configuration, the physical length of the first signal path SL1 between the first power amplifier PA1 and the first diplexer DPX1 and the physical length of the second signal path SL2 between the second power amplifier PA2 and the second diplexer DPX2 are sufficiently long. It is thus possible to provide the multiband-support radio-frequency module 1 exhibiting excellent RF characteristics by preventing the direct output of radio-frequency signals containing unwanted harmonic components to the output electrodes.

A portion of the first signal path SL1 which is subsequent to the first power amplifier PA1 and which is prior to the first diplexer DPX1 and a portion of the second signal path SL2 which is subsequent to the second power amplifier PA2 and which is prior to the second diplexer DPX2 intersect each other two or more times. Accordingly, the lengths of the signal paths SL1 and SL2 can be increased to be even longer. It is thus possible to provide the multiband-support radio-frequency module 1 exhibiting even more excellent RF characteristics by preventing the direct output of radio-frequency signals containing unwanted harmonic components to the output electrodes.

The physical length of the first signal path SL1 between the first power amplifier PA1 and the first diplexer DPX1 and the physical length of the second signal path SL2 between the second power amplifier PA2 and the second diplexer DPX2 are sufficiently long. Accordingly, at the above-described portions of the first and second signal paths SL1 and SL2, a directional coupler, a filter circuit, and so on, can be provided in each of the first and second signal paths SL1 and SL2.

Accordingly, in this embodiment, in an area where the first and second signal paths SL1 and SL2 intersect each other, the first and second directional couplers 61 and 62 are provided in the first and second signal paths SL1 and SL2, respectively, though they are not shown in FIGS. 2A to 2E. With this arrangement, the following advantages are obtained. The first directional coupler 61 is able to extract a radio-frequency signal output from the first power amplifier PA1 from the first signal path SL1, so that it can detect, for example, the signal level of the extracted radio-frequency signal by using, for example, a detection circuit. The second directional coupler 62 is able to extract a radio-frequency signal output from the second power amplifier PA2 from the second signal path SL2, so that it can detect, for example, the signal level of the extracted radio-frequency signal by using, for example, a detection circuit.

Since the first and second signal paths SL1 and SL2 intersect each other, the signal paths (wiring patterns) can become longer, thereby making it possible to improve the coupling amount and the directivity of the directional couplers 61 and 62. It is thus possible to exclude, for example, a radio-frequency signal of reflected waves returning from an antenna and to detect radio-frequency signals only output from the amplifier circuits 31 and 32 by using the directional couplers 61 and 62.

Second Embodiment

Figure 6:
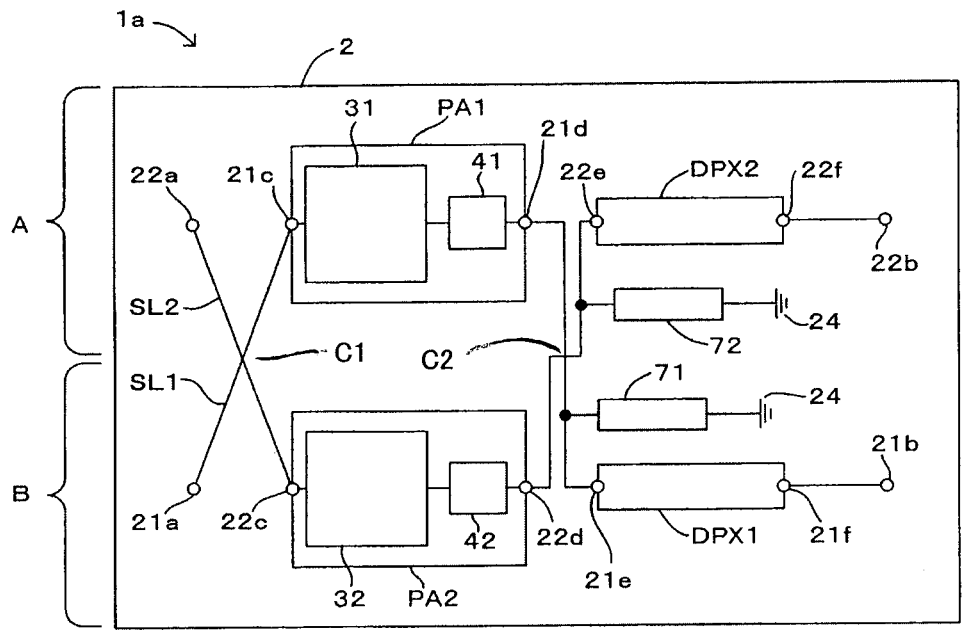
FIG. 6 is a diagram illustrating a second embodiment of a radio-frequency module of the present invention.

A second embodiment of a radio-frequency module of the present disclosure will be described below with reference to FIG. 6. FIG. 6 is a diagram illustrating the second embodiment of a radio-frequency module of the present invention.

A radio-frequency module 1a of this embodiment is different from the radio-frequency module 1 of the above-described first embodiment in the following configuration. As shown in FIG. 6, a third filter circuit 71 is disposed in the first signal path SL1, and a fourth filter circuit 72 is disposed in the second signal path SL2. The other configurations of the second embodiment are similar to those of the above-described first embodiment, and thus, they are designated by like reference numerals and an explanation thereof will be omitted.

The third and fourth filter circuits 71 and 72 may be formed as band-pass filters, as in the above-described first and second transmit filter circuits 51 and 52, or may be formed as band-elimination filters. As in the above-described first and second transmit filter circuits 51 and 52, the third and fourth filter circuits 71 and 72 are constituted by typical filter circuits, such as SAW (surface acoustic wave) filter devices, BAW (bulk acoustic wave) filter devices, LC filters, distributed constant circuit filters, and dielectric filters.

With this configuration, advantages similar to those of the above-described embodiment can be obtained, and the following advantages can also be obtained. By the provision of the third and fourth filter circuits 71 and 72 disposed in the first and second signal paths SL1 and SL2, respectively, harmonic components contained in radio-frequency signals output from the first and second power amplifiers PA1 and PA2 can be attenuated. It is thus possible to provide the radio-frequency module 1a exhibiting even more excellent RF characteristics.

As in the above-described first embodiment, the first and second directional couplers 61 and 62 may also be provided.

Third Embodiment

Figure 7:
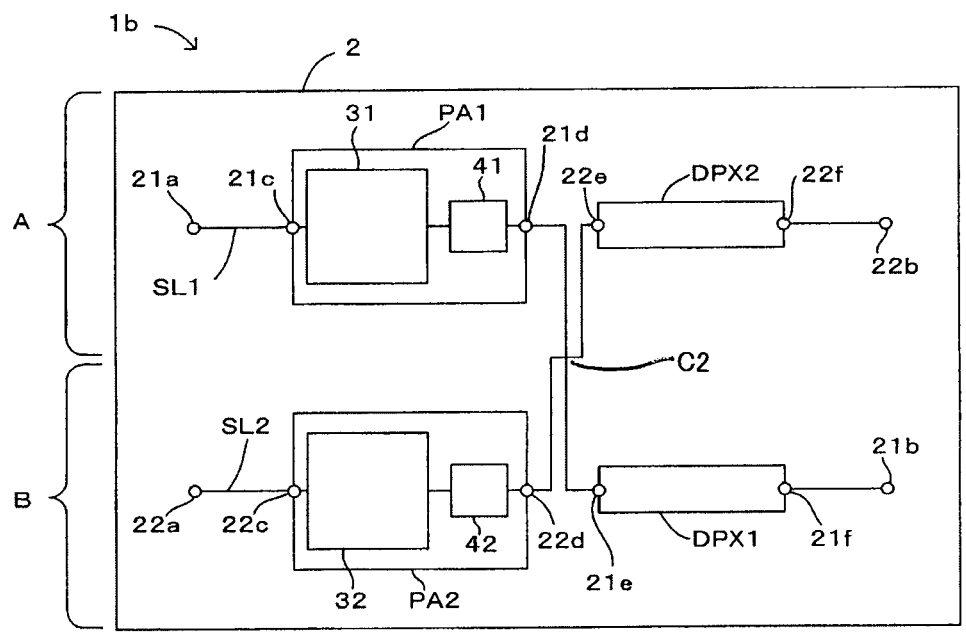
FIG. 7 is a diagram illustrating a third embodiment of a radio-frequency module of the present invention.

A third embodiment of a radio-frequency module of the present disclosure will be described below with reference to FIG. 7. FIG. 7 is a diagram illustrating the third embodiment of a radio-frequency module of the present invention.

A radio-frequency module 1b of this embodiment is different from the radio-frequency module 1 of the above-described first embodiment in the following configuration. As shown in FIG. 7, in an area prior to the first and second power amplifiers PA1 and PA2, the first and second signal paths SL1 and SL2 do not intersect each other. The other configurations of the third embodiment are similar to those of the above-described first embodiment, and thus, they are designated by like reference numerals and an explanation thereof will be omitted.

With this configuration, too, advantages similar to those of the above-described embodiment can be obtained.

In this embodiment, too, the above-described first and second directional couplers 61 and 62 and third and fourth filter circuits 71 and 72 may also be provided. The first and second directional couplers 61 and 62 and third and fourth filter circuits 71 and 72 may also be provided in fourth and fifth embodiments, which will be discussed below, and an explanation thereof will be omitted.

Fourth Embodiment

Figure 8:
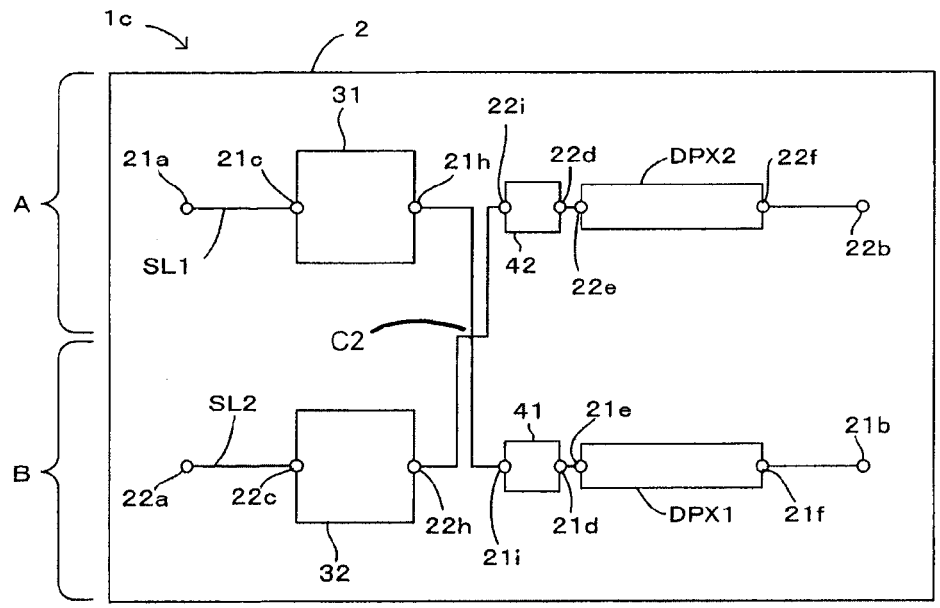
FIG. 8 is a diagram illustrating a fourth embodiment of a radio-frequency module of the present invention.

A fourth embodiment of a radio-frequency module of the present disclosure will be described below with reference to FIG. 8. FIG. 8 is a diagram illustrating the fourth embodiment of a radio-frequency module of the present invention.

A radio-frequency module 1c of this embodiment is different from the radio-frequency module 1 of the above-described first embodiment in the following configuration. As shown in FIG. 8, the first amplifier circuit 31 is disposed in the first region A of the multilayer substrate 2 and is mounted on mounting electrodes 21c and 21h, while the second amplifier circuit 32 is disposed in the second region B of the multilayer substrate 2 and is mounted on mounting electrodes 22c and 22h. The first matching circuit 41 is disposed in the second region B of the multilayer substrate 2 and is mounted on mounting electrodes 21d and 21i, while the second matching circuit 42 is disposed in the first region A of the multilayer substrate 2 and is mounted on mounting electrodes 22d and 22i. The first and second signal paths SL1 and SL2 intersect each other at C2 in an area subsequent to the first and second amplifier circuits 31 and 32 and prior to the first and second matching circuits 41 and 42. The wiring path SL1 which connects the first input electrode 21a and the first amplifier circuit 31 and the wiring path SL2 which connects the second input electrode 22a and the second amplifier circuit 32 do not intersect each other. The other configurations of the fourth embodiment are similar to those of the above-described first embodiment, and thus, they are designated by like reference numerals and an explanation thereof will be omitted.

With this configuration, too, advantages similar to those of the above-described embodiment can be obtained. The first matching circuit 41 and the first diplexer DPX1 provided in the first signal path SL1 are located in the second region B, which is different from the first region A of the multilayer substrate 2 in which the first amplifier circuit 31 is located. The second matching circuit 42 and the second diplexer DPX2 provided in the second signal path SL2 are located in the first region A, which is different from the second region B of the multilayer substrate 2 in which the second amplifier circuit 32 is located.

Accordingly, the position of the first matching circuit 42 and the first diplexer DPX1 and the position of the second matching circuit 42 and the second diplexer DPX2 are reversed between the first and second regions A and B. Thus, a portion of the first signal path SL1 which is subsequent to the first amplifier circuit 31 and which is prior to the first diplexer DPX1 and a portion of the second signal path SL2 which is subsequent to the second amplifier circuit 32 and which is prior to the second diplexer DPX2 intersect each other at least once in the multilayer substrate 2, as viewed from above. With this configuration, the physical length of the first signal path SL1 between the first amplifier circuit 31 and the first diplexer DPX1 and the physical length of the second signal path SL2 between the second amplifier circuit 32 and the second diplexer DPX2 are sufficiently long. It is thus possible to provide the multiband-support radio-frequency module 1c exhibiting excellent RF characteristics by preventing the output of radio-frequency signals containing unwanted harmonic components.

Fifth Embodiment

Figure 9:
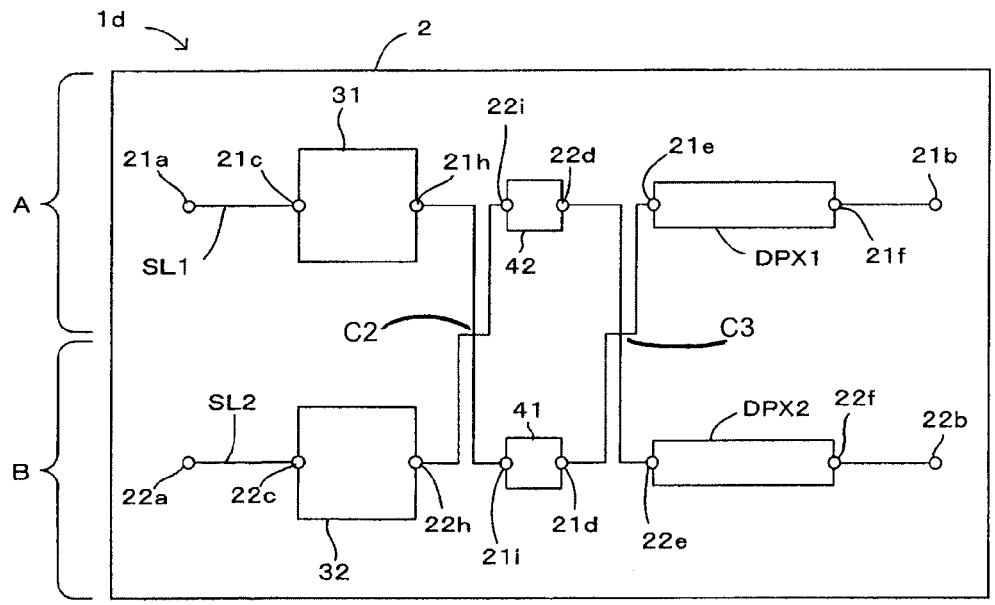
FIG. 9 is a diagram illustrating a fifth embodiment of a radio-frequency module of the present invention.

A fifth embodiment of a radio-frequency module of the present disclosure will be described below with reference to FIG. 9. FIG. 9 is a diagram illustrating the fifth embodiment of a radio-frequency module of the present invention.

A radio-frequency module 1d of this embodiment is different from the radio-frequency module 1c of the above-described fourth embodiment in the following configuration. As shown in FIG. 9, the first amplifier circuit 31 and the first diplexer DPX1 are disposed in the first region A of the multilayer substrate 2, while the second amplifier circuit 32 and the second diplexer DPX2 are disposed in the second region B of the multilayer substrate 2. The first matching circuit 41 is disposed in the second region B, while the second matching circuit 42 is disposed in the first region A. The first and second signal paths SL1 and SL2 intersect each other at C2 in an area subsequent to the first and second amplifier circuits 31 and 32 and prior to the first and second matching circuits 41 and 42. The first and second signal paths SL1 and SL2 also intersect each other at C3 in an area subsequent to the first and second matching circuits 41 and 42 and prior to the first and second diplexers DPX1 and DPX2. The other configurations of the fifth embodiment are similar to those of the above-described first embodiment, and thus, they are designated by like reference numerals and an explanation thereof will be omitted.

With this configuration, too, advantages similar to those of the above-described embodiment can be obtained.

The first and second signal paths SL1 and SL2 intersect each other two or more times (even number of times) in the multilayer substrate 2, as viewed from above. Accordingly, the first input electrode 21a and the first output electrode 21b are located in the same first region A of the multilayer substrate 2, and the second input electrode 22a and the second output electrode 22b are located in the same second region B of the multilayer substrate 2. It is thus possible to provide the radio-frequency module 1d of a practical structure in which, when externally connecting the radio-frequency module 1, the incorrect external connection of the electrodes 21a, 21b, 22a, and 22b can be prevented.

Sixth Embodiment

Figure 10:
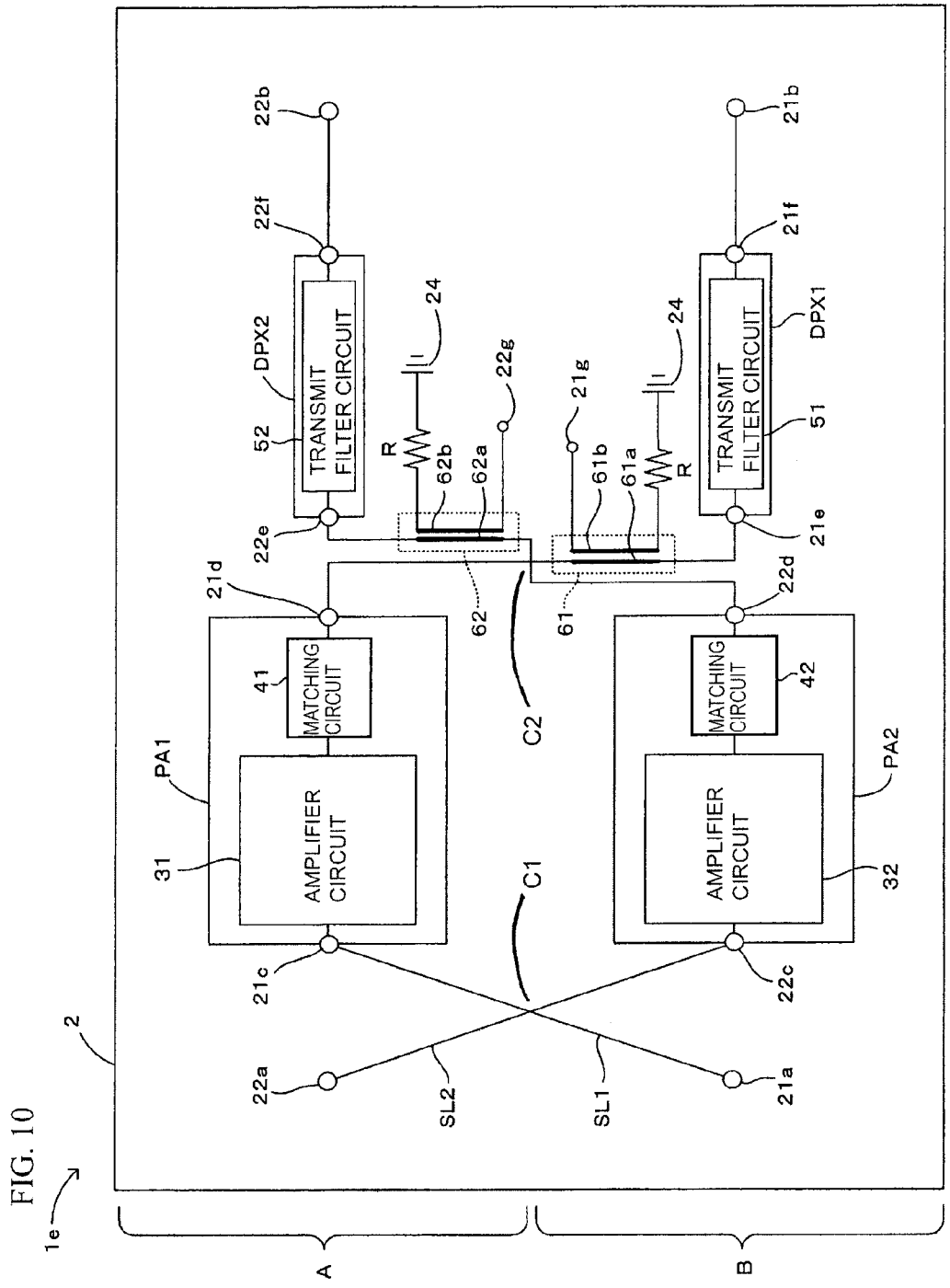
FIG. 10 is a diagram illustrating a sixth embodiment of a radio-frequency module of the present invention.

A sixth embodiment of a radio-frequency module of the present disclosure will be described below with reference to FIG. 10. FIG. 10 is a diagram illustrating the sixth embodiment of a radio-frequency module of the present invention.

A radio-frequency module 1e of this embodiment is different from the radio-frequency module 1 of the above-described first embodiment in the following configuration. As shown in FIG. 10, the other end of the coil pattern 61b is connected to a ground electrode 24 via a terminator R integrated in the radio-frequency module 1e, while the other end of the coil pattern 62b is connected to a ground electrode 24 via a terminator R integrated in the radio-frequency module 1e. The other configurations of the sixth embodiment are similar to those of the above-described first embodiment, and thus, they are designated by like reference numerals and an explanation thereof will be omitted.

With this configuration, too, advantages similar to those of the above-described embodiment can be obtained.

Seventh Embodiment

Figure 11:
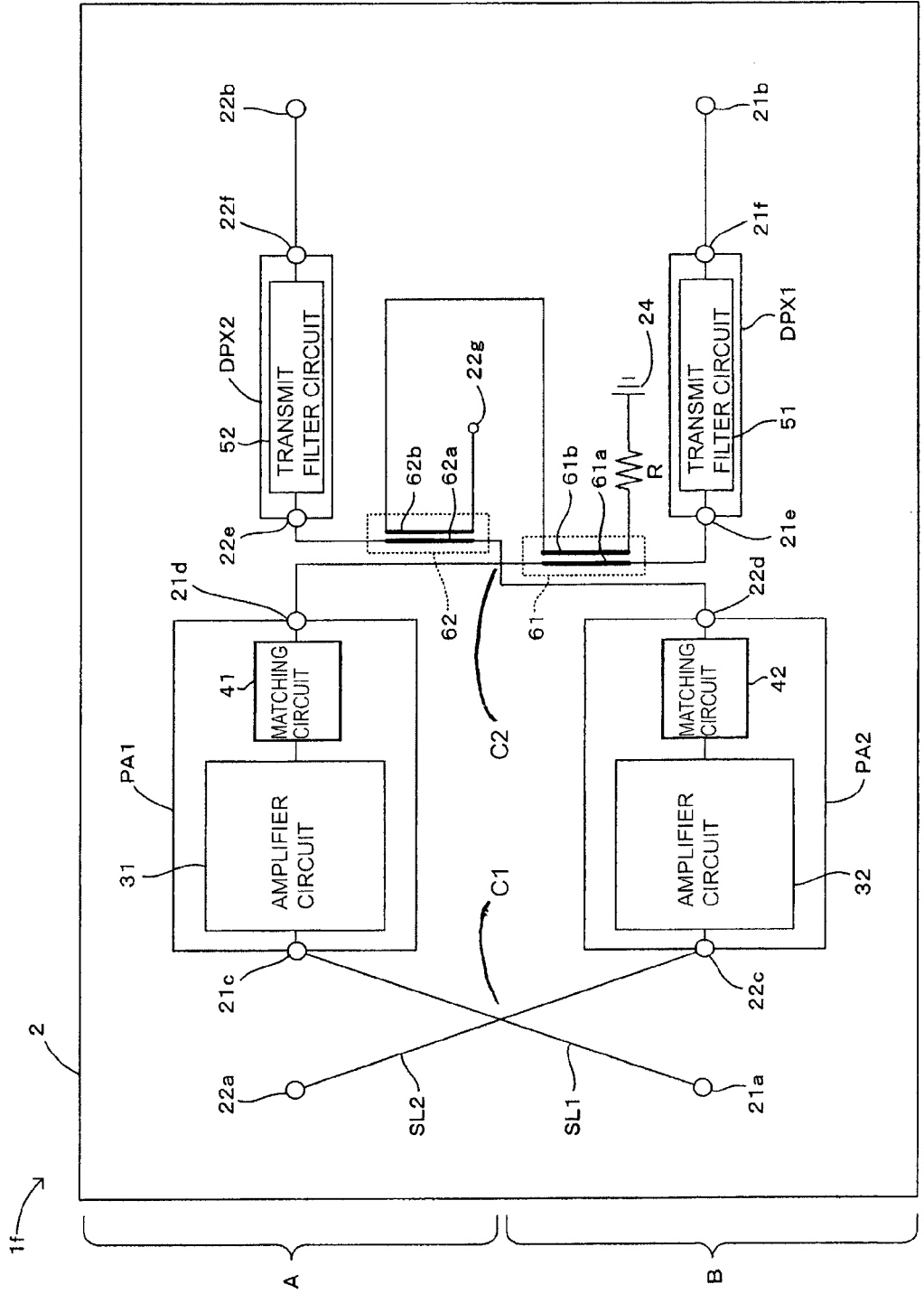
FIG. 11 is a diagram illustrating a seventh embodiment of a radio-frequency module of the present invention.

A seventh embodiment of a radio-frequency module of the present disclosure will be described below with reference to FIG. 11. FIG. 11 is a diagram illustrating the seventh embodiment of a radio-frequency module of the present invention.

A radio-frequency module 1f of this embodiment is different from the radio-frequency module 1 of the above-described first embodiment in the following configuration. As shown in FIG. 11, the other end of the coil pattern 61b is connected to a ground electrode 24 via a terminator R, and one end of the coil pattern 61b is connected to the other end of the coil pattern 62b. The other configurations of the seventh embodiment are similar to those of the above-described first embodiment, and thus, they are designated by like reference numerals and an explanation thereof will be omitted.

With this configuration, too, advantages similar to those of the above-described embodiment can be obtained.

Eighth Embodiment

Figure 12:
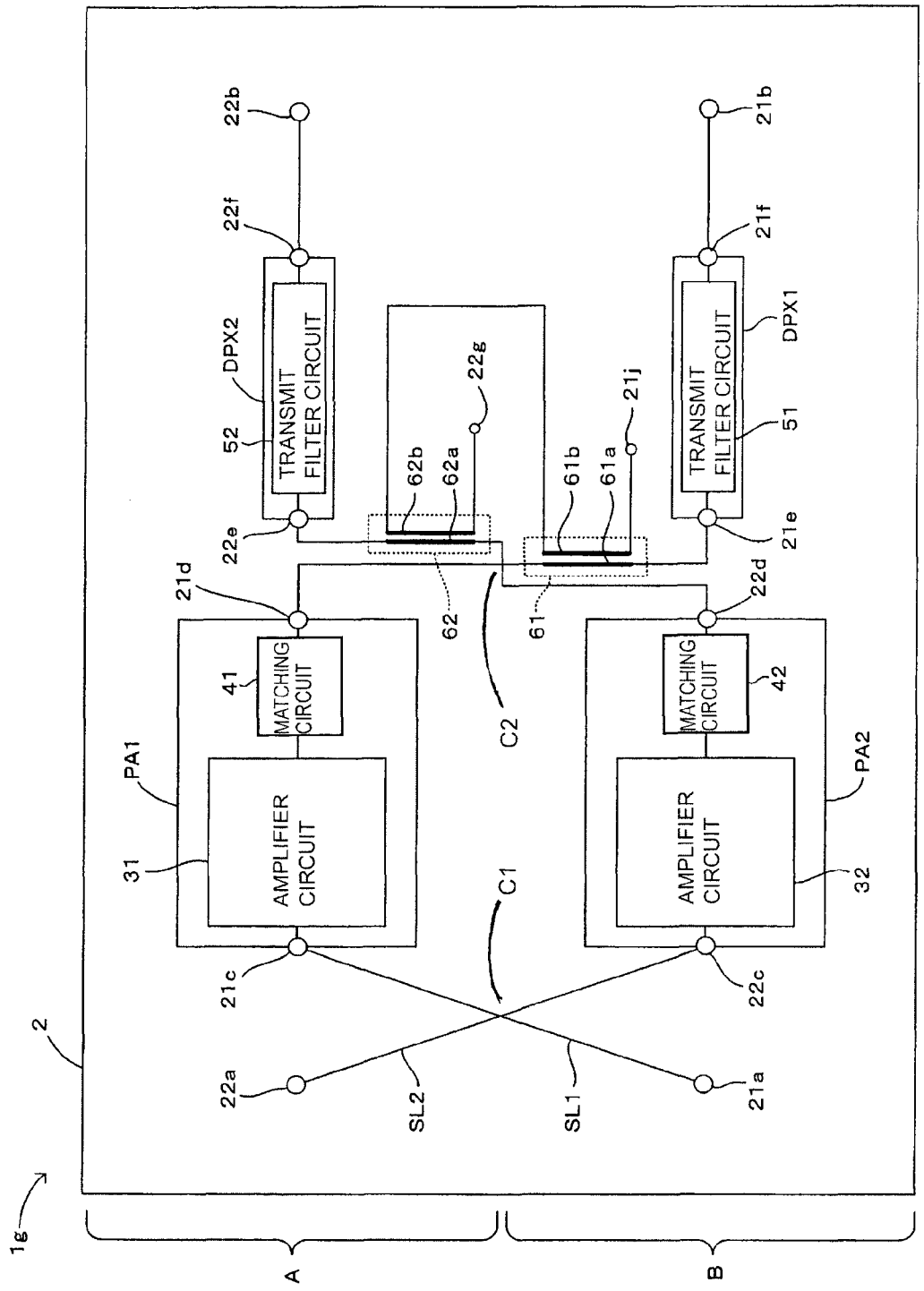
FIG. 12 is a diagram illustrating an eighth embodiment of a radio-frequency module of the present invention.
Figure 13A:
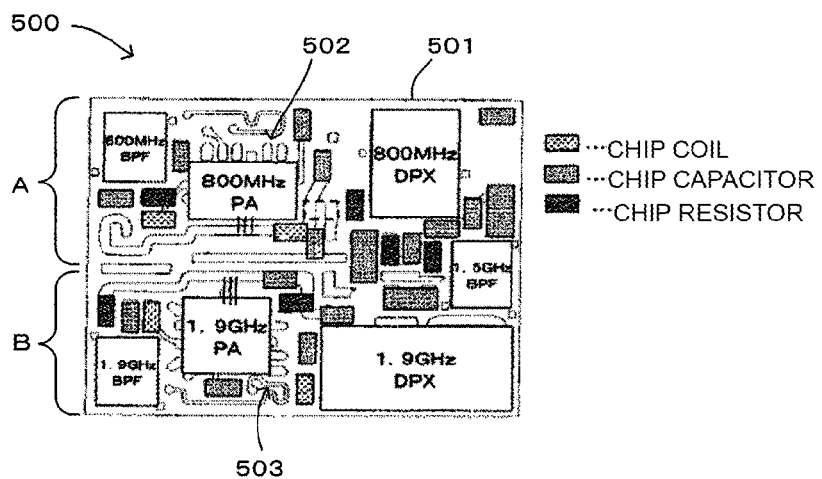
FIGS. 13A and 13B illustrate a known radio-frequency module.
Figure 13B:
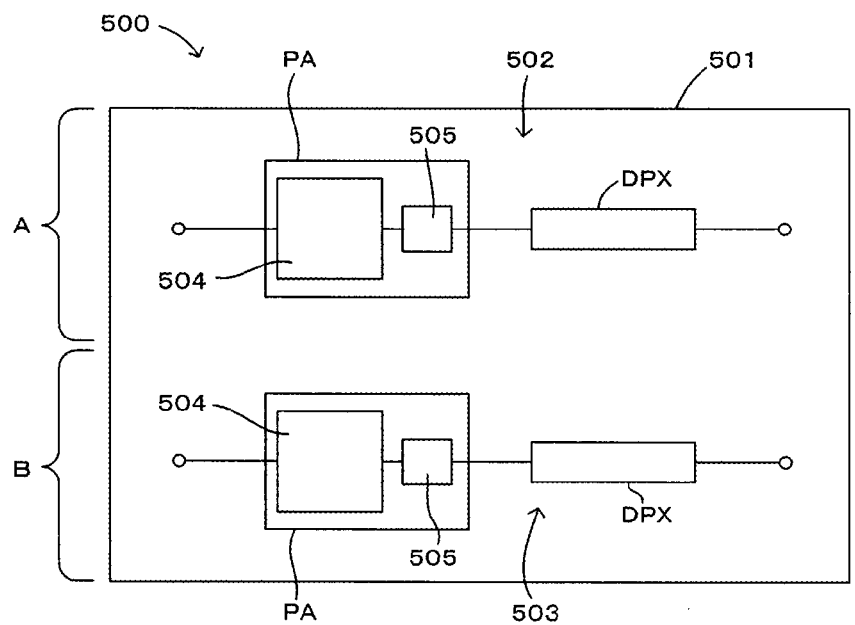

An eighth embodiment of a radio-frequency module of the present disclosure will be described below with reference to FIG. 12. FIG. 12 is a diagram illustrating the eighth embodiment of a radio-frequency module of the present invention.

A radio-frequency module 1g of this embodiment is different from the radio-frequency module 1 of the above-described first embodiment in the following configuration. As shown in FIG. 12, one end of the coil pattern 61b is connected to the other end of the coil pattern 62b. The other configurations of the eighth embodiment are similar to those of the above-described first embodiment, and thus, they are designated by like reference numerals and an explanation thereof will be omitted.

With this configuration, too, advantages similar to those of the above-described embodiment can be obtained.

The present disclosure is not restricted to the above-described embodiments, and various modifications other than those described above may be made without departing from the spirit of the invention. The configurations of the above-described embodiments may be combined in any manner. That is, the present disclosure may be modified in any manner as long as a portion of the first signal path which is subsequent to the first amplifier circuit and which is prior to the first filter circuit and a portion of the second signal path which is subsequent to the second amplifier circuit and which is prior to the second filter circuit intersect each other at least once in the multilayer substrate, as viewed from above.

The frequency bands used in a radio-frequency module are not restricted to the above-described examples, and may be changed suitably in accordance with, for example, the communication bands of a communication device on which the radio-frequency module is mounted. Another communication path may be provided in a radio-frequency module. By providing a communication path used in a communication system using a GPS system or the Bluetooth (registered trademark) standard or a communication system in which communication is performed by using multiple communication standards, such as voice communication and data communication standards, the radio-frequency module may be used as a multiband- or multimode-support radio-frequency module.

In the above-described embodiments, the radio-frequency modules including diplexers have been discussed by way of example. However, as the first and second filter circuits of the present invention, simple filter circuits may be mounted on a multilayer substrate. A filter circuit may further be disposed in an area prior to each of the first and second amplifier circuits.

The present disclosure are widely applicable to a radio-frequency module including a multilayer substrate in which a first signal path through which a radio-frequency signal of a first frequency band passes and a second signal path through which a radio-frequency signal of a second frequency band passes are provided.

1, 1a, 1b, 1c, 1d, 1e, 1f, 1g radio-frequency module
2 multilayer substrate
31 first amplifier circuit
32 second amplifier circuit
41 first matching circuit
42 second matching circuit
51 first transmit filter circuit (first filter circuit)
52 second transmit filter circuit (second filter circuit)
61 first directional coupler
62 second directional coupler
71 third filter circuit
72 fourth filter circuit
A first region
B second region
SL1 first signal path
SL2 second signal path

The invention claimed is:

1. A radio-frequency module including a multilayer substrate having a first signal path through which a radio-frequency signal of a first frequency band passes and a second signal path through which a radio-frequency signal of a second frequency band passes, wherein:
the first signal path includes a first amplifier circuit, a first matching circuit connected subsequent to the first amplifier circuit, and a first filter circuit connected subsequent to the first matching circuit;
the second signal path includes a second amplifier circuit, a second matching circuit connected subsequent to the second amplifier circuit, and a second filter circuit connected subsequent to the second matching circuit; and
a portion of the first signal path which is subsequent to the first amplifier circuit and which is prior to the first filter circuit and a portion of the second signal path which is subsequent to the second amplifier circuit and which is prior to the second filter circuit intersect each other at least once in the multilayer substrate, as viewed from above.

2. The radio-frequency module according to claim 1, wherein:
the first amplifier circuit is disposed in a first region of the multilayer substrate;
the second amplifier circuit is disposed in a second region of the multilayer substrate;
the first filter circuit is disposed in the second region; and
the second filter circuit is disposed in the first region.

3. The radio-frequency module according to claim 1, wherein:
the first amplifier circuit is disposed in a first region of the multilayer substrate;
the second amplifier circuit is disposed in a second region of the multilayer substrate;

the first matching circuit is disposed in the second region; and the second matching circuit is disposed in the first region.

4. The radio-frequency module according to claim 1, wherein the first signal path and the second signal path intersect each other two or more times.

5. The radio-frequency module according to claim 1, wherein a first directional coupler is disposed in the first signal path, and a second directional coupler is disposed in the second signal path.

6. The radio-frequency module according to claim 1, wherein a third filter circuit is disposed in the first signal path, and a fourth filter circuit is disposed in the second signal path.

7. The radio-frequency module according to claim 2, wherein the first signal path and the second signal path intersect each other two or more times.

8. The radio-frequency module according to claim 3, wherein the first signal path and the second signal path intersect each other two or more times.

9. The radio-frequency module according to claim 2, wherein a first directional coupler is disposed in the first signal path, and a second directional coupler is disposed in the second signal path.

10. The radio-frequency module according to claim 3, wherein a first directional coupler is disposed in the first signal path, and a second directional coupler is disposed in the second signal path.

11. The radio-frequency module according to claim 4, wherein a first directional coupler is disposed in the first signal path, and a second directional coupler is disposed in the second signal path.

12. The radio-frequency module according to claim 2, wherein a third filter circuit is disposed in the first signal path, and a fourth filter circuit is disposed in the second signal path.

13. The radio-frequency module according to claim 3, wherein a third filter circuit is disposed in the first signal path, and a fourth filter circuit is disposed in the second signal path.

14. The radio-frequency module according to claim 4, wherein a third filter circuit is disposed in the first signal path, and a fourth filter circuit is disposed in the second signal path.

15. The radio-frequency module according to claim 5, wherein a third filter circuit is disposed in the first signal path, and a fourth filter circuit is disposed in the second signal path.

* * * * *